United States Patent
Matsuda et al.

(10) Patent No.: US 8,575,681 B2
(45) Date of Patent: Nov. 5, 2013

(54) SEMICONDUCTOR MEMORY DEVICE AND METHOD FOR MANUFACTURING SAME

(75) Inventors: Toru Matsuda, Mie-ken (JP); Tomoya Osaki, Mie-ken (JP); Masaru Kito, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/570,602

(22) Filed: Aug. 9, 2012

(65) Prior Publication Data

US 2013/0113032 A1 May 9, 2013

(30) Foreign Application Priority Data

Nov. 4, 2011 (JP) .................................. 2011-242262

(51) Int. Cl.
*H01L 29/792* (2006.01)
(52) U.S. Cl.
USPC ..................... 257/316; 257/324; 257/E29.309
(58) Field of Classification Search
USPC .................. 257/316, 319, 324, 328, E21.423, 257/E29.309; 438/261, 268
See application file for complete search history.

(56) References Cited

U.S. PATENT DOCUMENTS

| | | | |
|---|---|---|---|
| 7,910,976 B2 * | 3/2011 | Fastow | 257/316 |
| 8,072,024 B2 * | 12/2011 | Ishikawa et al. | 257/324 |
| 8,394,680 B2 * | 3/2013 | Lee | 438/129 |
| 2010/0207195 A1 | 8/2010 | Fukuzumi et al. | |
| 2010/0320528 A1 * | 12/2010 | Jeong et al. | 257/324 |
| 2012/0012920 A1 * | 1/2012 | Shin et al. | 257/324 |
| 2012/0032249 A1 | 2/2012 | Matsuda | |

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

A semiconductor memory device includes a substrate, a conductive layer provided on a major surface of the substrate, a stacked body, a memory film, and a channel body. The stacked body includes multiple insulating layers alternately stacked with multiple electrode layers on the conductive layer. The memory film includes a charge storage film provided on side walls of holes made to pierce the stacked body. The channel body includes a pair of columnar portions and a linking portion. The pair of columnar portions is provided on an inner side of the memory film inside the holes. The linking portion is provided inside the conductive layer to link lower ends of the pair of columnar portions. The electrode layers are tilted with respect to the major surface of the substrate. The columnar portions of the channel body and the memory film pierce the tilted portion of the electrode layers.

10 Claims, 6 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-242262, filed on Nov. 4, 2011; the entire contents of which are incorporated herein by reference.

FIELD

Embodiments described herein relate generally to a semiconductor memory device and a method for manufacturing same.

BACKGROUND

A memory device has been proposed in which memory cells are three-dimensionally arranged by making memory holes in a stacked body in which multiple insulating layers are alternately stacked with multiple electrode layers that function as control gates of the memory cells, forming a charge storage film on the side walls of the memory holes, and subsequently providing silicon used to form a channel inside the memory holes.

Further, in such a memory device, a memory string structure having a U-shaped configuration has been proposed in which the memory string includes a pair of columnar portions extending in the stacking direction of the stacked body, which includes multiple layers of the electrode layers, and a linking portion that is buried in the back gate to link the pair of columnar portions.

DETAILED DESCRIPTION

Figure 1:
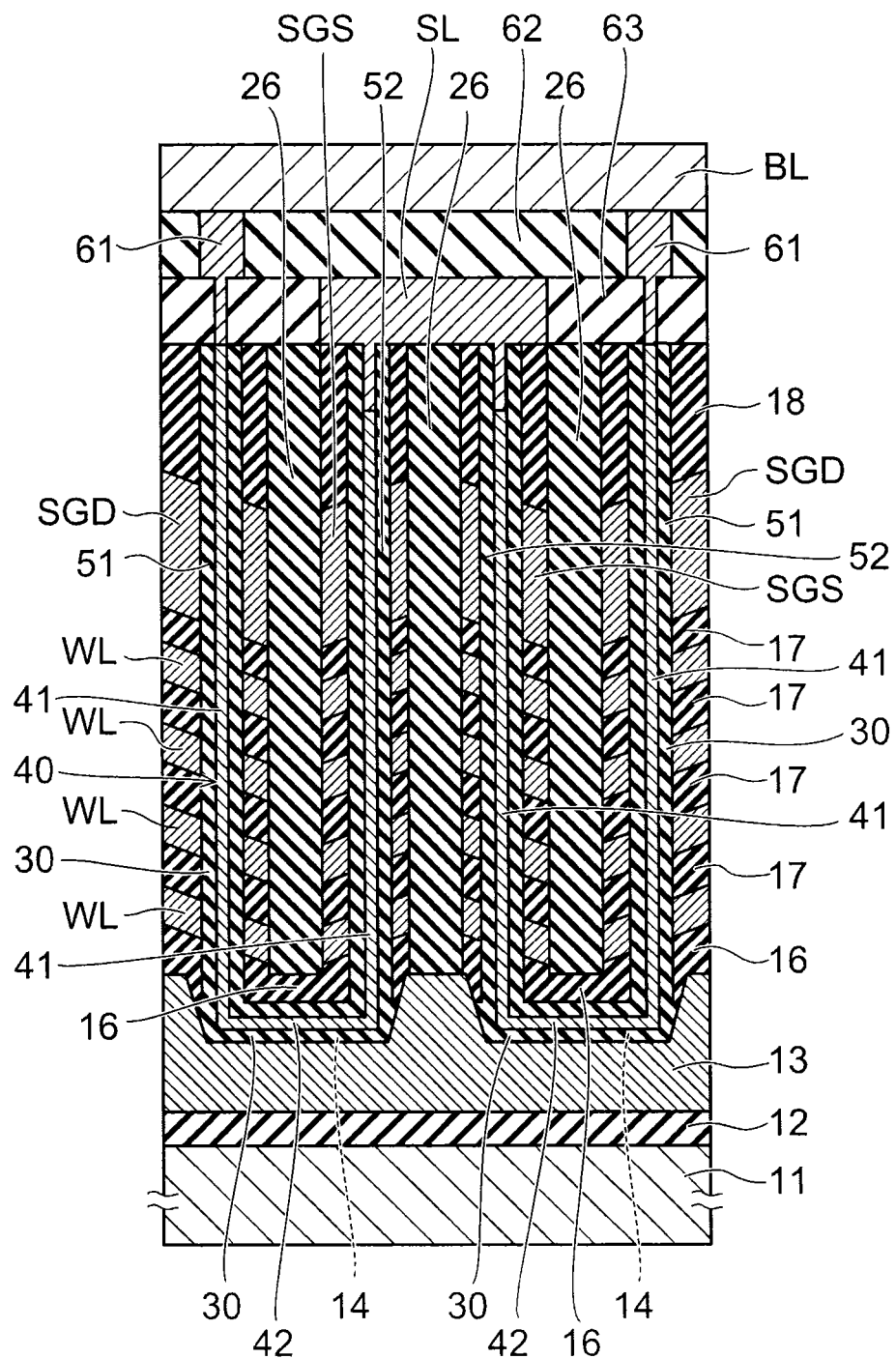
FIG. 1 is a schematic cross-sectional view of a memory cell array of the semiconductor memory device of an embodiment.

According to an embodiment, a semiconductor memory device includes a substrate having a major surface, a conductive layer provided on the major surface of the substrate, a stacked body, a memory film, and a channel body. The stacked body includes multiple insulating layers alternately stacked with multiple electrode layers on the conductive layer. The memory film includes a charge storage film provided on side walls of holes made to pierce the stacked body. The channel body includes a pair of columnar portions and a linking portion, where the pair of columnar portions is provided on an inner side of the memory film inside the holes, and the linking portion is provided inside the conductive layer to link lower ends of the pair of columnar portions. The electrode layers are tilted with respect to the major surface of the substrate. The columnar portions of the channel body and the memory film pierce the tilted portion of the electrode layers.

Embodiments will now be described with reference to the drawings. Similar components in the drawings are marked with like reference numerals.

FIG. 1 is a schematic cross-sectional view of a memory cell array of the semiconductor memory device of the embodiment.

Figure 2:
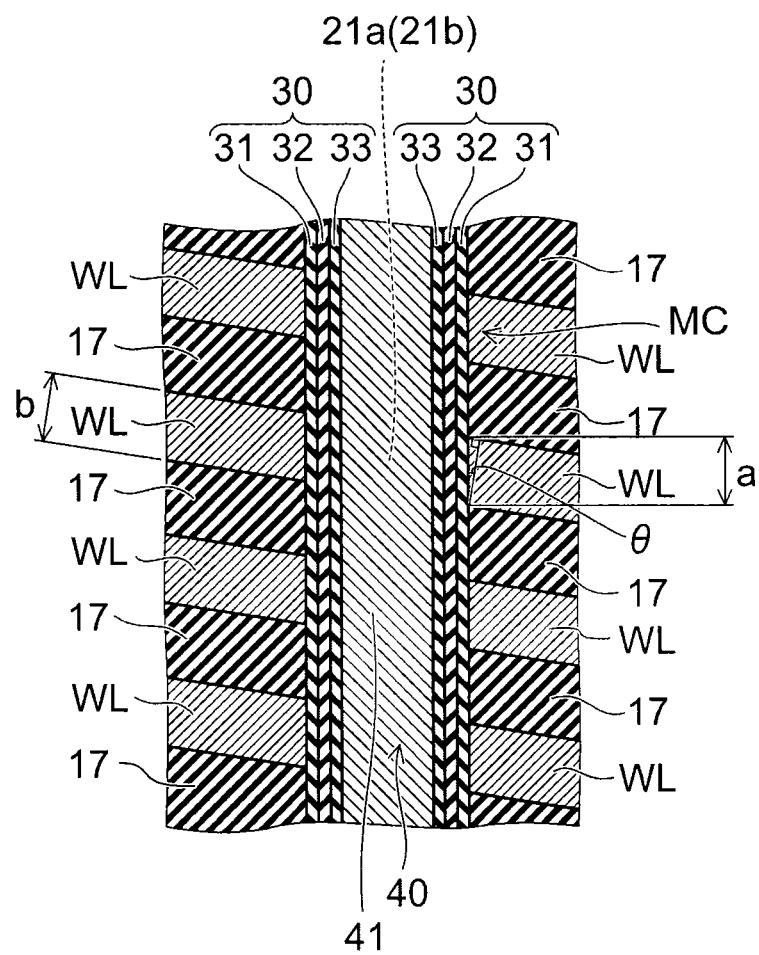
FIG. 2 is an enlarged cross-sectional view of a portion of FIG. 1.

FIG. 2 is an enlarged cross-sectional view of a portion of FIG. 1 where memory cells are provided.

A back gate 13 is provided on a major surface of a substrate 11 with an insulating layer 12 interposed. The back gate 13 is a conductive layer, e.g., a silicon layer having conductivity by an impurity being added.

The substrate 11 may include, for example, a silicon substrate; and a not-illustrated peripheral circuit is formed in the surface of the substrate 11.

A first insulating layer (hereinbelow, also called simply the insulating layer) 16 is provided on the back gate 13. As described below, a trench 14 is made in the back gate 13; and the insulating layer 16 is provided also inside the trench 14 at the upper portion on the opening side.

By the trench 14 being made in the back gate 13, an unevenness is formed in the surface of the back gate 13. In other words, a step between the upper surface of the back gate 13 and the side wall of the trench 14 on the opening side is formed. The insulating layer 16 is formed to cover the step.

Because the foundation of the insulating layer 16 is not flat, it is possible to provide the upper surface of the insulating layer 16 with a tilt by appropriately controlling the film thickness of the insulating layer 16. In other words, the upper surface of the insulating layer 16 is tilted with respect to the major surface of the substrate 11. In the example illustrated in FIG. 1, the insulating layer 16 is tilted downward from the portion of the insulating layer 16 outside the region where the trench 14 is made toward the portion of the insulating layer 16 positioned on the region where the trench 14 is made.

Multiple electrode layers WL are alternately stacked with multiple second insulating layers (hereinbelow, also called simply the insulating layers) 17 on the insulating layer 16.

The electrode layer WL may include, for example, a silicon layer having conductivity by an impurity being added. The insulating layer 17 may include, for example, a tetraethoxysilane (TEOS) layer including silicon oxide.

As described above, the insulating layer 16 has a portion tilted with respect to the major surface of the substrate 11. The electrode layers WL and the insulating layers 17 that are provided on the tilted portion also are tilted with respect to the major surface of the substrate 11. Similarly to the insulating layer 16, in the example illustrated in FIG. 1, the electrode layers WL and the insulating layers 17 are tilted downward from the portions of the electrode layers WL and the insulating layers 17 outside the region where the trench 14 is made toward the portions of the electrode layers WL and the insulating layers 17 positioned on the region where the trench 14 is made. The insulating layers 17 are tilted along the tilt of the electrode layers WL.

By appropriately controlling the film thicknesses of the electrode layers WL, the electrode layers WL can be tilted with respect to the major surface of the substrate 11 while the film thicknesses of the electrode layers WL are uniform. The film thicknesses of the electrode layers WL themselves are the same between the portion of the electrode layers WL outside the region where the trench 14 is made and the portion of the electrode layers WL positioned on the region where the trench 14 is made. The film thicknesses of the electrode layers WL can be controlled by controlling the film formation conditions of the electrode layers WL (the film formation material type, the film formation time, the pressure inside the film formation chamber, the amount of the gas introduced to the film formation chamber, the substrate temperature, and the like).

The number of layers of the electrode layers WL is arbitrary and is not limited to the four layers illustrated in FIG. 1. The electrode layer WL is divided into a plurality by an insulator 26.

For example, a drain-side selection gate SGD is provided on the electrode layer WL of the uppermost layer on the left-most side of FIG. 1 and the electrode layer WL of the uppermost layer on the right-most side of FIG. 1 with the insulating layer 17 interposed; and the drain-side selection gate SGD is provided as another electrode layer that functions differently from the electrode layers WL.

The drain-side selection gate SGD may include, for example, a silicon layer having conductivity by an impurity being added. The insulating layer 17 of the layer under the drain-side selection gate SGD is tilted with respect to the major surface of the substrate 11. Accordingly, the drain-side selection gate SGD also is tilted with respect to the major surface of the substrate 11 along the tilt of the electrode layers WL. In the example illustrated in FIG. 1, the drain-side selection gate SGD is tilted downward from the portion of the drain-side selection gate SGD outside the region where the trench 14 is made toward the portion of the drain-side selection gate SGD positioned on the region where the trench 14 is made.

In FIG. 1, a source-side selection gate SGS is provided with the insulating layer 17 interposed on the electrode layer WL of the uppermost layer of a stacked body that forms a pair with the stacked body that includes the drain-side selection gate SGD; and the source-side selection gate SGS is provided as another electrode layer that functions differently from the electrode layers WL.

The source-side selection gate SGS may include, for example, a silicon layer having conductivity by an impurity being added. The insulating layer 17 of the layer under the source-side selection gate SGS is tilted with respect to the major surface of the substrate 11. Accordingly, the source-side selection gate SGS also is tilted with respect to the major surface of the substrate 11 along the tilt of the electrode layers WL. In the example illustrated in FIG. 1, the source-side selection gate SGS is tilted downward from the portion of the source-side selection gate SGS outside the region where the trench 14 is made toward the portion of the source-side selection gate SGS positioned on the region where the trench 14 is made.

By appropriately controlling the film thicknesses of the drain-side selection gate SGD and the source-side selection gate SGS, the drain-side selection gate SGD and the source-side selection gate SGS can be tilted with respect to the major surface of the substrate 11 while the film thicknesses of the drain-side selection gate SGD and the source-side selection gate SGS are uniform. The film thicknesses of the drain-side selection gate SGD and the source-side selection gate SGS can be controlled by controlling the film formation conditions of the drain-side selection gate SGD and the source-side selection gate SGS (the film formation material type, the film formation time, the pressure inside the film formation chamber, the amount of the gas introduced to the film formation chamber, the substrate temperature, and the like).

A source line SL is provided on the source-side selection gate SGS with an insulating layer 18 interposed. The source line SL may include, for example, a metal layer.

A bit line BL which is a metal interconnect is provided on the drain-side selection gate SGD with the insulating layers 18, 63, and 62 interposed. In FIG. 1, the bit line BL is multiply arranged in parallel in the direction piercing the page surface. Each of the bit lines BL extends in the lateral direction in FIG. 1. The insulating layer 62 is interposed between the bit line BL and the source line SL.

Figure 5A:
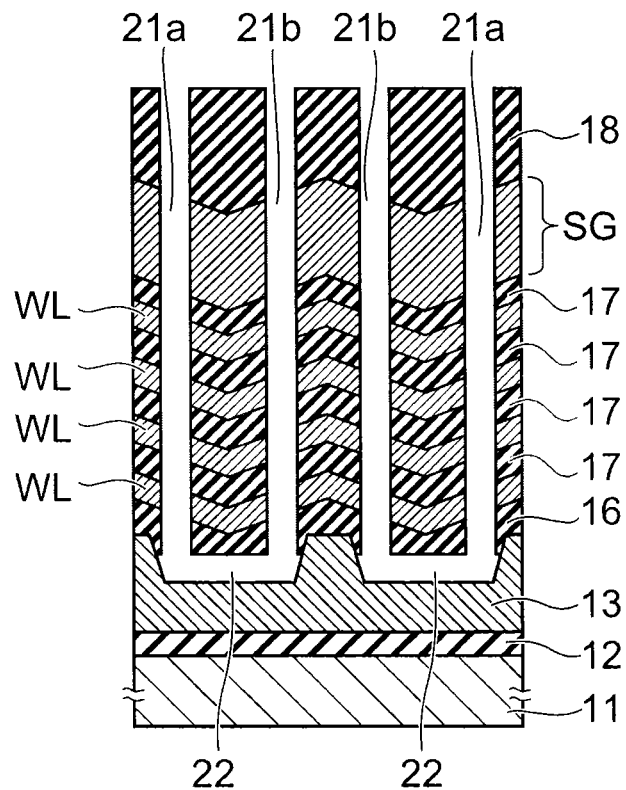

As illustrated in FIG. 5A, a memory hole having a U-shaped configuration and including a space 22 and a pair of holes 21a and 21b is multiply made in the back gate 13 and in the stacked body on the back gate 13.

The hole 21a and the hole 21b pierce the selection gate (the drain-side selection gate SGD or the source-side selection gate SGS) and the stacked body including the electrode layers WL under the selection gate. The lower end of each of the pair of the hole 21a and the hole 21b communicates with the space 22 made inside the back gate 13; and the hole 21a, the hole 21b, and the space 22 make a memory hole having a U-shaped configuration.

As illustrated in FIG. 1, a channel body 40 is provided in a U-shaped configuration in the interior of the memory hole. The channel body 40 may include, for example, a silicon film. A memory film 30 is provided between the channel body 40 and the inner wall of the memory hole.

A gate insulating film 51 is provided between the drain-side selection gate SGD and the channel body 40. A gate insulating film 52 is provided between the source-side selection gate SGS and the channel body 40.

This structure is not limited to the structure in which the channel body 40 fills the entire interior of the memory hole; and the channel body 40 may be formed such that a hollow portion remains on the central axis side of the memory hole. Alternatively, a structure may be used in which an insulator is filled into a hollow portion inside the channel body 40.

The channel body 40 includes a pair of columnar portions 41 provided respectively in the interiors of the holes 21a and 21b described above and a linking portion 42 provided inside the space 22 inside the back gate 13. The lower end of each of the pair of columnar portions 41 communicates with the linking portion 42.

The columnar portions 41 of the channel body 40 are perpendicular to the major surface of the substrate 11. The memory film 30 and the columnar portions 41 of the channel body 40 pierce the portion of the electrode layers WL tilted with respect to the major surface of the substrate 11. In the example illustrated in FIG. 1, the electrode layers WL are tilted downward from the portion of the electrode layers WL outside the region where the linking portion 42 is provided toward the portion of the electrode layers WL positioned on the region where the linking portion 42 is provided.

As illustrated in FIG. 2, the memory film 30 includes a blocking film 31 as a first insulating film, a charge storage film 32, and a tunneling film 33 as a second insulating film. The blocking film 31, the charge storage film 32, and the tunneling film 33 are provided in order from the electrode layer WL side between the channel body 40 and the electrode layers WL. The blocking film 31 contacts the electrode layers WL; the tunneling film 33 contacts the channel body 40; and the charge storage film 32 is provided between the blocking film 31 and the tunneling film 33.

The channel body 40 functions as a channel of a memory cell (a transistor) MC; the electrode layer WL functions as a control gate; and the charge storage film 32 functions as a data storage layer configured to store charge injected from the channel body 40. In other words, the memory cell MC having a structure in which a control gate is provided around the channel is formed at the intersections between the channel body 40 and the electrode layers WL.

The semiconductor memory device of the embodiment is a nonvolatile semiconductor memory device that can freely and electrically erase/program data and maintain the stored content even when the power supply is OFF.

The memory cell MC is, for example, a charge trap memory cell MC. The charge storage film 32 has many trap sites to trap the charge and may include, for example, a silicon nitride film.

The tunneling film 33 may include, for example, a silicon oxide film and is used as a potential barrier when the charge is injected from the channel body 40 into the charge storage film 32 or when the charge stored in the charge storage film 32 diffuses into the channel body 40.

The blocking film 31 may include, for example, a silicon oxide film and prevents the charge stored in the charge storage film 32 from diffusing into the electrode layer WL.

The drain-side selection gate SGD, the channel body 40, and the gate insulating film 51 between the drain-side selection gate SGD and the channel body 40 illustrated in FIG. 1 form a drain-side selection transistor. The channel body 40 of the drain-side selection transistor is connected to the bit line BL via a plug 61 piercing the insulating layers 62 and 63.

The source-side selection gate SGS, the channel body 40, and the gate insulating film 52 between the source-side selection gate SGS and the channel body 40 form a source-side selection transistor. The channel body 40 of the source-side selection transistor is connected to the source line SL.

The back gate 13, the channel body 40 provided inside the back gate 13, and the memory film 30 provided inside the back gate 13 form a back gate transistor.

Multiple memory cells MC having the electrode layers WL as control gates are provided between the drain-side selection transistor and the back gate transistor. Similarly, multiple memory cells MC having the electrode layers WL as control gates are provided between the back gate transistor and the source-side selection transistor.

The multiple memory cells MC, the drain-side selection transistor, the back gate transistor, and the source-side selection transistor are connected in series via the channel body 40 to form one memory string having a U-shaped configuration. The memory string is multiply arranged in the lateral direction and the direction piercing the page surface in FIG. 1. Accordingly, the multiple memory cells are arranged three-dimensionally.

Although the storage capacity generally increases as the number of stacks of the electrode layers WL increases, the cost of forming the electrode layers WL also increases. The film formation cost can be reduced by the film thicknesses of the electrode layers WL being thin. Here, in the case of a structure in which the electrode layers are provided parallel to the major surface of the substrate as a comparative example, there is a risk that the gate length of the memory cell (the transistor) may shorten and the reliability may decrease as the film thicknesses of the electrode layers WL are reduced.

Conversely, according to the embodiment, the electrode layers WL are stacked to be tilted with respect to the major surface of the substrate 11. By the electrode layers WL being tilted, the gate length of the memory cell MC can be lengthened without changing the film thickness from the case where the electrode layers WL are provided parallel to the major surface of the substrate 11; and the manufacturing cost can be reduced while increasing reliability.

According to the embodiment, the gate length of the portion of the electrode layer WL opposing the columnar portion 41 of the channel body 40 via the memory film 30 (a in FIG. 2) is larger than the film thickness of the electrode layer WL (b in FIG. 2).

In the case where an angle $\theta$ between the gate length direction a and the film thickness direction b of the electrode layer WL of FIG. 2 is, for example, 45°, the film thickness b is $1/\cos \theta$ times the gate length a, that is, about 0.71 times the gate length a. Accordingly, the film formation cost of the electrode layers WL can be reduced to less than about ¾ of that of the structure of the comparative example in which the gate length a and the film thickness b are the same.

A method for manufacturing the semiconductor memory device of the embodiment will now be described with reference to FIG. 3A to FIG. 6B. The method for forming the memory cell array is described below.

Figure 3A:
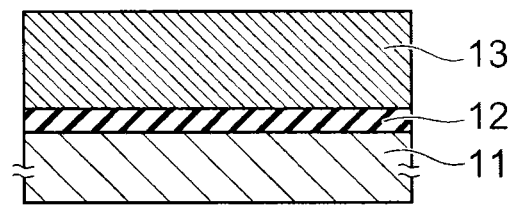
FIGS. 3A-3C, 4A, 4B, 5A, 5B, 6A, and 6B are schematic cross-sectional diagrams showing a method for manufacturing the semiconductor memory device of the embodiment.
Figure 3B:
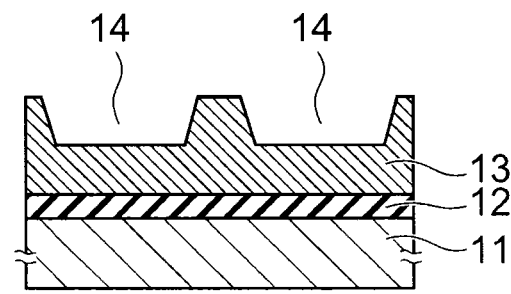

As illustrated in FIG. 3A, the back gate 13 is formed on the substrate 11 with the insulating layer 12 interposed. A not-illustrated resist mask is formed on the back gate 13; and the trench 14 illustrated in FIG. 3B is made in the back gate 13 by etching using the resist mask.

Figure 3C:
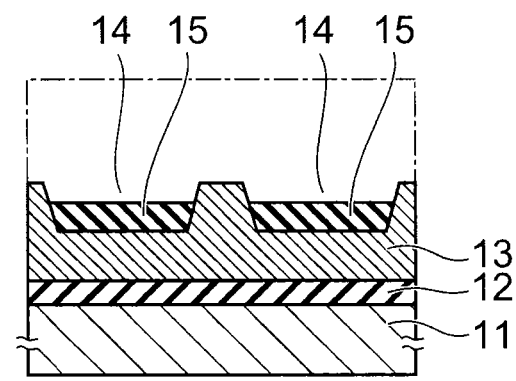

A sacrificial film 15 illustrated in FIG. 3C is provided inside the trench 14. The sacrificial film 15 may include, for example, a silicon nitride film.

Specifically, first, as illustrated by the single dot-dash line in FIG. 3C, the sacrificial film 15 is deposited above the opening of the trench 14 and on the upper surface of the back gate 13 while filling the trench 14.

Subsequently, the upper surface of the sacrificial film 15 is caused to recede toward the back gate 13 side by etching such that the upper surface of the back gate 13 is exposed and the portion of the sacrificial film 15 filled into the trench 14 on the opening side is removed.

The upper surface of the back gate 13 is exposed between adjacent trenches 14. The etching amount of the sacrificial film 15 is controlled such that the portion of the sacrificial film 15 lower than the upper portion on the opening side (on the bottom side) inside the trench 14 remains. As a result, an unevenness is formed on the front surface side of the back gate 13. In other words, a step is formed between the upper surface of the back gate 13 and the side wall of the trench 14 on the opening side.

Figure 4A:
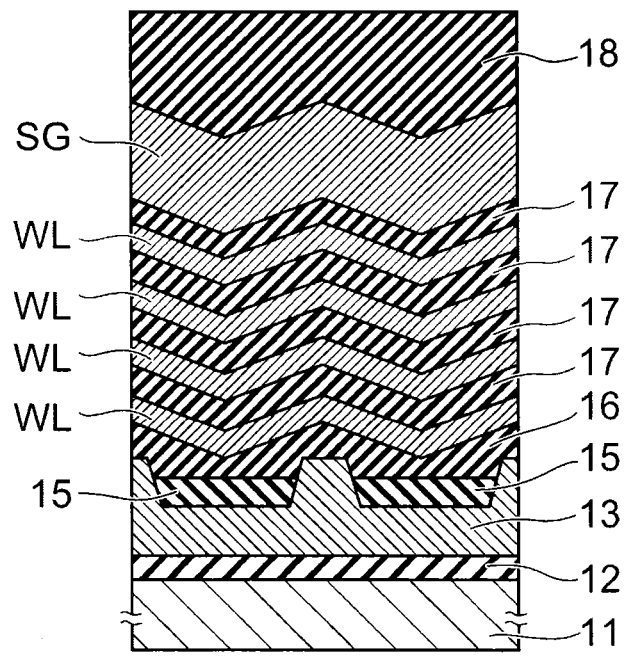

As illustrated in FIG. 4A, the insulating layer 16 is formed on the back gate 13 and on the sacrificial film 15 to cover the step.

The front surface side of the back gate 13 is not flat but has an unevenness. Accordingly, an unevenness that reflects the unevenness of the back gate 13 can be formed also in the insulating layer 16 by appropriately controlling the film thickness of the insulating layer 16.

In other words, the portion of the insulating layer 16 above the trench 14 is relatively recessed; and the portion of the insulating layer 16 above the protrusion of the back gate 13 between the trenches 14 is relatively protruding. Accordingly, a tilted surface that is tilted with respect to the major surface of the substrate 11 is formed in the upper surface of the insulating layer 16.

A stacked body including the multiple electrode layers WL and the multiple insulating layers 17 is formed on the insulating layer 16. The electrode layers WL and the insulating layers 17 are alternately stacked; and the insulating layers 17 are interposed between the electrode layers WL.

As described above, the upper surface of the insulating layer 16 which is the foundation of the stacked body recited above is not flat but has a tilted surface. Accordingly, the electrode layers WL and the insulating layers 17 can be formed to match the tilt of the upper surface of the insulating layer 16 by appropriately controlling the film thicknesses of the electrode layers WL and the insulating layers 17. In other words, the electrode layers WL and the insulating layers 17 can be tilted with respect to the major surface of the substrate 11 while having uniform film thicknesses.

For example, the portion of the electrode layers WL above the trench 14 is relatively recessed; and the portion of the electrode layers WL above the protrusion of the back gate 13 between the trenches 14 is relatively protruding. Similarly, the portion of the insulating layers 17 above the trench 14 is relatively recessed; and the portion of the insulating layers 17 above the protrusion of the back gate 13 between the trenches 14 is relatively protruding.

A selection gate SG used to form the drain-side selection gate SGD or the source-side selection gate SGS described above is formed on the electrode layer WL of the uppermost layer with the insulating layer 17 interposed.

The selection gate SG also can be formed to match the tilt of the stacked body upper surface of the layer under the selection gate SG by appropriately controlling the film thickness of the selection gate SG. In other words, the selection gate SG can be tilted with respect to the major surface of the substrate 11 while having a uniform film thickness. For example, the portion of the selection gate SG above the trench 14 is relatively recessed; and the portion of the selection gate SG above the protrusion of the back gate 13 between the trenches 14 is relatively protruding.

The insulating layer 18 is formed on the selection gate SG; and the upper surface of the insulating layer 18 is planarized by, for example, Chemical Mechanical Polishing (CMP).

Figure 4B:
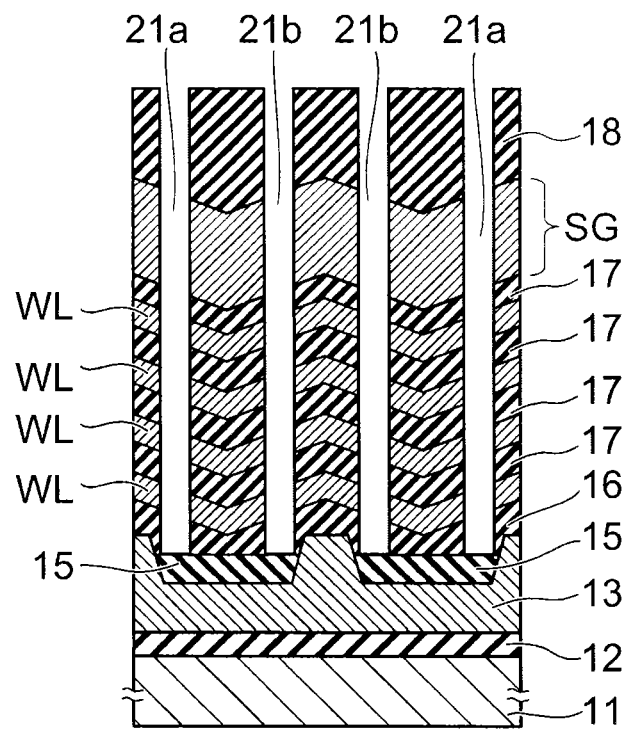

As illustrated in FIG. 4B, the holes 21a and 21b are made in the stacked body on the back gate 13 described above. The holes 21a and 21b are made, for example, by Reactive Ion Etching (RIE) using a not-illustrated mask.

The lower ends of the holes 21a and 21b reach the sacrificial film 15 to expose the sacrificial film 15 at the bottom portions of the holes 21a and 21b. The sacrificial film 15 is removed through the holes 21a and 21b by, for example, wet etching.

By the removal of the sacrificial film 15 as illustrated in FIG. 5A, the space 22 is made under the insulating layer 16 inside the trench 14 made in the back gate 13. The lower ends of the pair of holes 21a and 21b communicate with the space 22 to make one memory hole having a U-shaped configuration.

Figure 5B:
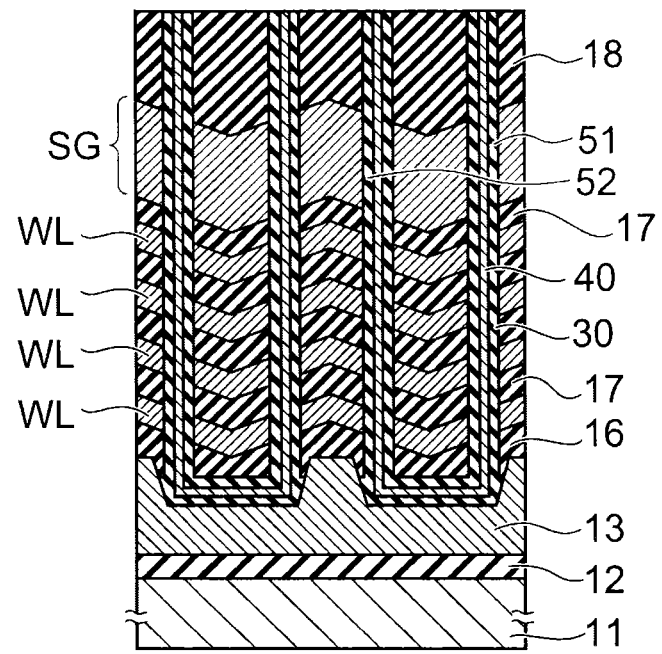

As illustrated in FIG. 5B, the memory film 30 described above is formed on the inner wall of the memory hole. Then, the channel body 40 is formed on the inner side of the memory film 30 inside the memory hole.

Figure 6A:
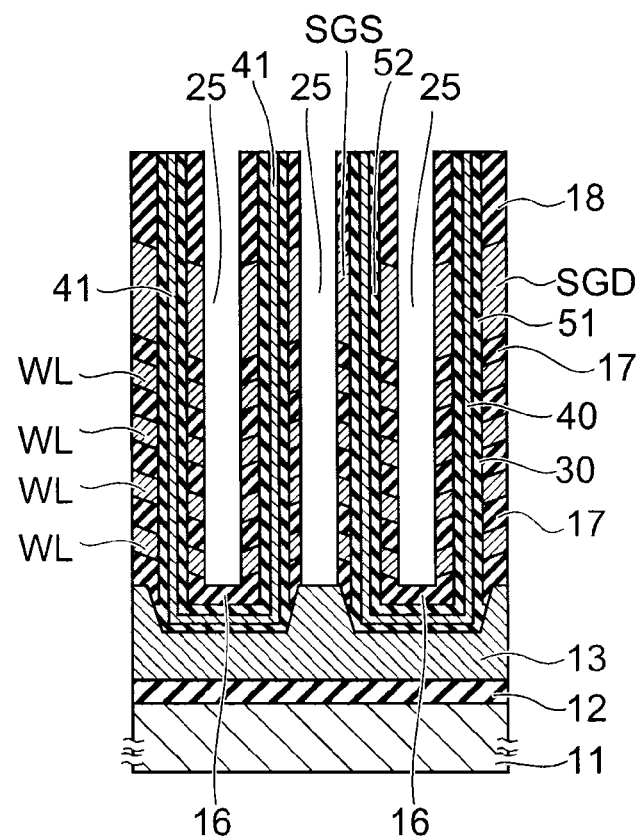

As illustrated in FIG. 6A, a slit 25 is made in the stacked body obtained in the processes described above. The slit 25 is made between the pair of columnar portions 41 of the channel body 40; and the bottom of the slit 25 reaches the insulating layer 16. The slit 25 divides adjacent memory strings; and the bottom of the slit 25 reaches the upper surface of the protrusion of the back gate 13.

The slit 25 divides the selection gate SG into the drain-side selection gate SGD and the source-side selection gate SGS. The slit 25 divides the electrode layers WL into the block on the drain-side selection gate SGD side and the block on the source-side selection gate SGS side.

Figure 6B:
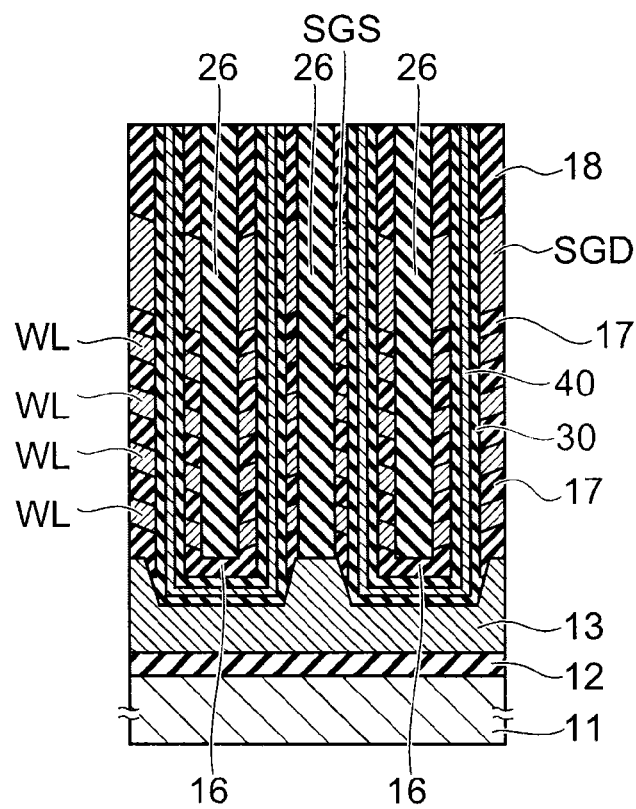

As illustrated in FIG. 6B, the insulator 26 is filled into the slit 25. The insulator 26 may include, for example, silicon oxide, silicon nitride, and the like. Subsequently, the source line SL, the bit line BL, etc., illustrated in FIG. 1 are formed.

According to the embodiment, the upper surface of the layer used to form the foundation of the stacked body including the electrode layers WL can be tilted with respect to the major surface of the substrate 11 by controlling the etch-back amount of the sacrificial film 15 provided in the trench 14 of the back gate 13. Processes are not added to existing processes that form the U-shaped memory strings. Accordingly, the multiple electrode layers WL can easily be stacked to be tilted with respect to the major surface of the substrate 11 while suppressing cost increases.

The slit 25 may be made simultaneously when making the holes 21a and 21b illustrated in FIG. 4B. Subsequently, an insulator is filled into the holes 21a and 21b and the slit 25.

Then, a memory hole having a U-shaped configuration is made by removing the sacrificial film 15 by etching via the holes 21a and 21b after removing the insulator inside the holes 21a and 21b. Thereafter, the formation of the memory film 30 and the channel body 40 inside the memory hole continues similarly to the embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a substrate having a major surface;
   a conductive layer provided on the major surface of the substrate;
   a stacked body including a plurality of insulating layers alternately stacked with a plurality of electrode layers on the conductive layer;
   a memory film including a charge storage film provided on a side wall of a hole made to pierce the stacked body; and
   a channel body including a pair of columnar portions and a linking portion, the pair of columnar portions being provided on an inner side of the memory film inside the hole, the linking portion being provided inside the conductive layer to link lower ends of the pair of columnar portions,
   the electrode layers being tilted with respect to the major surface of the substrate, the columnar portions of the channel body and the memory film being configured to pierce the tilted portion of the electrode layers.

2. The device according to claim 1, wherein the electrode layers are tilted downward from a portion of the electrode layers outside a region where the linking portion is provided toward a portion of the electrode layers positioned on the region where the linking portion is provided.

3. The device according to claim 1, wherein a gate length of a portion of the electrode layers opposing the columnar portions of the channel body via the memory film is larger than a film thickness of the electrode layers.

4. The device according to claim 1, wherein film thicknesses of the electrode layers are uniform.

5. The device according to claim 1, wherein the insulating layers also are tilted with respect to the major surface of the substrate along the tilt of the electrode layers.

6. The device according to claim 5, wherein the insulating layers are tilted downward from a portion of the insulating layers outside a region where the linking portion is provided toward a portion of the insulating layers positioned on the region where the linking portion is provided.

7. The device according to claim 1, further comprising a selection gate provided on the insulating layer of an uppermost layer, the selection gate also being tilted with respect to the major surface of the substrate along the tilt of the electrode layers.

8. The device according to claim 7, wherein the selection gate is tilted downward from a portion of the selection gate outside a region where the linking portion is provided toward a portion of the selection gate positioned on the region where the linking portion is provided.

9. The device according to claim 1, wherein:
an unevenness is provided in a surface of the conductive layer; and
the linking portion of the channel body is provided in a recess of the conductive layer.

10. The device according to claim 1, wherein the columnar portions of the channel body are perpendicular to the major surface of the substrate.

* * * * *